United States Patent
Yeh et al.

(10) Patent No.: US 8,578,245 B2
(45) Date of Patent: *Nov. 5, 2013

(54) DATA READING METHOD, MEMORY STORAGE APPARATUS, AND CONTROLLER THEREOF

(75) Inventors: Chih-Kang Yeh, Kinmen County (TW); Chien-Fu Tseng, Yunlin County (TW); Chung-Lin Wu, Taichung (TW)

(73) Assignee: Phison Electronics Corp., Miaoli (TW)

( * ) Notice: Subject to any disclaimer, the term of this patent is extended or adjusted under 35 U.S.C. 154(b) by 233 days.

This patent is subject to a terminal disclaimer.

(21) Appl. No.: 13/037,381

(22) Filed: Mar. 1, 2011

(65) Prior Publication Data

US 2012/0144267 A1    Jun. 7, 2012

(30) Foreign Application Priority Data

Dec. 1, 2010   (TW) ............................... 99141787 A

(51) Int. Cl.
*G11C 29/00*    (2006.01)
*G01R 31/30*    (2006.01)

(52) U.S. Cl.
USPC .............................. 714/773; 714/721; 714/745

(58) Field of Classification Search
USPC ......... 714/721, 745, 704, 718, 719, 819, 824, 714/6.1, 42, 47.1, 47.2; 365/200, 201
See application file for complete search history.

(56) References Cited

U.S. PATENT DOCUMENTS

2009/0055680 A1*  2/2009  Honda et al. ...................... 714/5
2010/0211833 A1*  8/2010  Weingarten ................... 714/704

* cited by examiner

*Primary Examiner* — Guy Lamarre
(74) *Attorney, Agent, or Firm* — Jianq Chyun IP Office

(57) ABSTRACT

A data reading method for a rewritable non-volatile memory module is provided, wherein the rewritable non-volatile memory module has a plurality of physical pages. The data reading method includes grouping the physical pages into a plurality of physical page groups and configuring a corresponding threshold voltage set for each of the physical page groups. The data reading method also includes respectively reading data from the physical pages of the physical page groups by using the corresponding threshold voltage sets. The data reading method further includes when data read from one of the physical pages of one of the physical page groups cannot be corrected by using an error checking and correcting (ECC) circuit, updating the threshold voltage set corresponding to the physical page group.

19 Claims, 11 Drawing Sheets

DATA READING METHOD, MEMORY STORAGE APPARATUS, AND CONTROLLER THEREOF

CROSS-REFERENCE TO RELATED APPLICATION

This application claims the priority benefit of Taiwan application serial no. 99141787, filed Dec. 1, 2010. The entirety of the above-mentioned patent application is hereby incorporated by reference herein and made a part of this specification.

BACKGROUND

1. Technology Field

The invention generally relates to a data reading method for a rewritable non-volatile memory, and more particularly, to a method for correctly reading data from a rewritable non-volatile memory by adjusting the read voltage when the data cannot be corrected, and a memory controller and a memory storage apparatus using the same.

2. Description of Related Art

In recently years, the consumers' demand to storage media for storing digital contents has increased drastically along with the widespread of digital cameras, cell phones, and MP3. Flash memory is one of the most adaptable storage media to be carried around and used for storing digital files due to its characteristics such as data non-volatility, low power consumption, small volume, and non-mechanical structure. A solid state drive (SSD) is a storage device which uses a flash memory as its storage medium, and SSD has been broadly applied into computer host systems as the primary hard disk.

Existing flash memories can be categorized into NOR flash memories and NAND flash memories. Flash memories may also be categorized into multi-level cell (MLC) flash memories and single-level cell (SLC) flash memories based on the number of data bits stored in each memory cell. Each memory cell of a SLC flash memory can store only one bit of data, while each memory cell of a MLC flash memory can store at least two bits of data. Taking a 4-level cell flash memory as an example, each memory cell thereof can store two bits of data (i.e., "11", "10", "00", and "01").

The memory cells of a flash memory are connected by bit lines and word lines to form a memory cell array. When a control circuit for controlling the bit lines and the word lines reads data from or writes data into specific memory cells of the memory cell array, the floating voltages on other memory cells may be disturbed so that error bits may be produced (i.e., data read by the control circuit from a memory cell (also referred to as a read data) is different from the previously written data (also referred to as a write data). Or, when a flash memory is worn out due to long-term idle, electric leakage, or repeated erasing or writing operations, floating voltages on the memory cells may also be changed and accordingly error bits may occur.

A memory storage apparatus is usually disposed with an error checking and correcting (ECC) circuit. When data is written, the ECC circuit generates an ECC code for the data. When subsequently the data is read, the ECC circuit performs error correcting and decoding (also referred to as an error correcting procedure) on the data according to the corresponding ECC code, so as to correct any error bit. However, the ECC circuit can only correct a limited number of error bits, and data cannot be corrected if the number of error bits in the data exceeds the number of error bits that can be corrected by the ECC circuit. In this case, the host system cannot correctly data read from the memory storage apparatus. The number of error bits will be increased due to the advancement in fabrication process and the characteristics of memory hardware structures (for example, the more data bits are stored in each memory cell of a MLC flash memory, the more error bits may occur). Thereby, how to ensure the accuracy of read data has become one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a data reading method, a memory controller, and a memory storage apparatus, wherein data stored in a rewritable non-volatile memory can be correctly read.

According to an exemplary embodiment of the invention, a data reading method for a rewritable non-volatile memory module is provided, wherein the rewritable non-volatile memory module has a plurality of physical pages. The data reading method includes grouping the physical pages into a plurality of physical page groups and configuring a corresponding threshold voltage set for each of the physical page groups, wherein each of the threshold voltage sets includes a plurality of threshold voltages. The data reading method also includes respectively reading data from the physical pages of the physical page groups by using the corresponding threshold voltage sets. The data reading method further includes when the data read from one of the physical pages of one of the physical page groups cannot be corrected by using an error checking and correcting (ECC) circuit, updating the threshold voltage set corresponding to the physical page group.

According to an exemplary embodiment of the invention, a data reading method for a rewritable non-volatile memory module is provided, wherein the rewritable non-volatile memory module has a plurality of physical pages that are sequentially arranged. The data reading method includes obtaining first data from a first physical page among the physical pages by using at least one threshold voltage and determining whether the first data can be corrected by using an ECC circuit to generate a first corrected data corresponding to the first physical page. The data reading method also includes obtaining second data from a second physical page among the physical pages if the first data cannot be corrected by using the ECC circuit to generate the first corrected data corresponding to the first physical page, wherein the second physical page is adjacent to the first physical page, and the second data can be corrected by using the ECC circuit to generate a second corrected data corresponding to the second physical page. The data reading method further includes comparing the second data with the second corrected data corresponding to the second physical page to obtain error bit information, calculating at least one compensation voltage according to the error bit information, adjusting the threshold voltage into an adjusted threshold voltage according to the compensation voltage, obtaining another first data from the first physical page by using the adjusted threshold voltage, and correcting the another first data by using the ECC circuit to generate the first corrected data corresponding to the first physical page.

According to an exemplary embodiment of the invention, a memory controller for controlling a rewritable non-volatile memory module is provided, wherein the rewritable non-volatile memory module has a plurality of physical pages. The memory controller includes a memory management circuit and a host interface, a memory interface, an ECC circuit, and a read voltage updating circuit coupled to the memory management circuit. The memory management circuit groups the physical pages into a plurality of physical page groups, configures a corresponding threshold voltage set for each of the physical page groups, and respectively reads data from the physical pages of the physical page groups by using the corresponding threshold voltage sets, wherein each of the threshold voltage sets includes a plurality of threshold voltages. The memory interface is configured to couple to the rewritable non-volatile memory module. When data read by the memory management circuit from one of the physical pages of one of the physical page groups cannot be corrected by the ECC circuit, the read voltage updating circuit updates the threshold voltage set corresponding to the physical page group.

According to an exemplary embodiment of the invention, a memory controller for controlling a rewritable non-volatile memory module is provided, wherein the rewritable non-volatile memory module has a plurality of physical pages that are sequentially arranged. The memory controller includes a memory management circuit and a host interface, a memory interface, an ECC circuit, and a read voltage updating circuit coupled to the memory management circuit. The memory interface is configured to couple to the rewritable non-volatile memory module. The memory management circuit obtains first data from a first physical page by using at least one threshold voltage and determines whether the ECC circuit can correct the first data to generate a first corrected data corresponding to the first physical page. If the ECC circuit cannot correct the first data to generate the first corrected data corresponding to the first physical page, the memory management circuit obtains second data from a second physical page, wherein the second physical page is adjacent to the first physical page, and the second data is corrected by the ECC circuit to generate a second corrected data corresponding to the second physical page. The read voltage updating circuit compares the second data with the second corrected data corresponding to the second physical page to obtain error bit information, calculates at least one compensation voltage according to the error bit information, and adjusts the threshold voltage into an adjusted threshold voltage according to the compensation voltage. The memory management circuit further obtains another first data from the first physical page by using the adjusted threshold voltage, and the ECC circuit corrects the other first data to generate the first corrected data corresponding to the first physical page.

According to an exemplary embodiment of the invention, a memory storage apparatus including a connector, a rewritable non-volatile memory module, and a memory controller is provided. The connector is configured to couple to a host system. The rewritable non-volatile memory module has a plurality of physical pages. The memory controller is coupled to the connector and the rewritable non-volatile memory module and has an ECC circuit. The memory controller groups the physical pages into a plurality of physical page groups, configures a corresponding threshold voltage set for each of the physical page groups, and respectively reads data from the physical pages of the physical page groups by using the corresponding threshold voltage sets, wherein each of the threshold voltage sets includes a plurality of threshold voltages. When data read by the memory controller from one of the physical pages of one of the physical page groups cannot be corrected by the ECC circuit, the memory controller updates the threshold voltage set corresponding to the physical page group.

According to an exemplary embodiment of the invention, a memory storage apparatus including a connector, a rewritable non-volatile memory module, and a memory controller is provided. The connector is configured to couple to a host system. The rewritable non-volatile memory module has a plurality of physical pages. The memory controller is coupled to the connector and the rewritable non-volatile memory module and has an ECC circuit. The memory controller obtains first data from a first physical page among the physical pages by using at least one threshold voltage and determines whether the ECC circuit can correct the first data to generate a first corrected data corresponding to the first physical page. If the ECC circuit cannot correct the first data to generate the first corrected data corresponding to the first physical page, the memory controller obtains second data from a second physical page among the physical pages, wherein the second physical page is adjacent to the first physical page, and the second data is corrected by the ECC circuit to generate a second corrected data corresponding to the second physical page. In addition, the memory controller compares the second data with the second corrected data corresponding to the second physical page to obtain error bit information, calculates at least one compensation voltage according to the error bit information, and adjusts the threshold voltage into an adjusted threshold voltage according to the compensation voltage. Moreover, the memory controller obtains another first data from the first physical page by using the adjusted threshold voltage, and the ECC circuit corrects the other first data to generate the first corrected data corresponding to the first physical page.

As described above, exemplary embodiments of the invention provide a data reading method, a memory controller, and a memory storage apparatus, wherein the accuracy of read data is effectively ensured.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
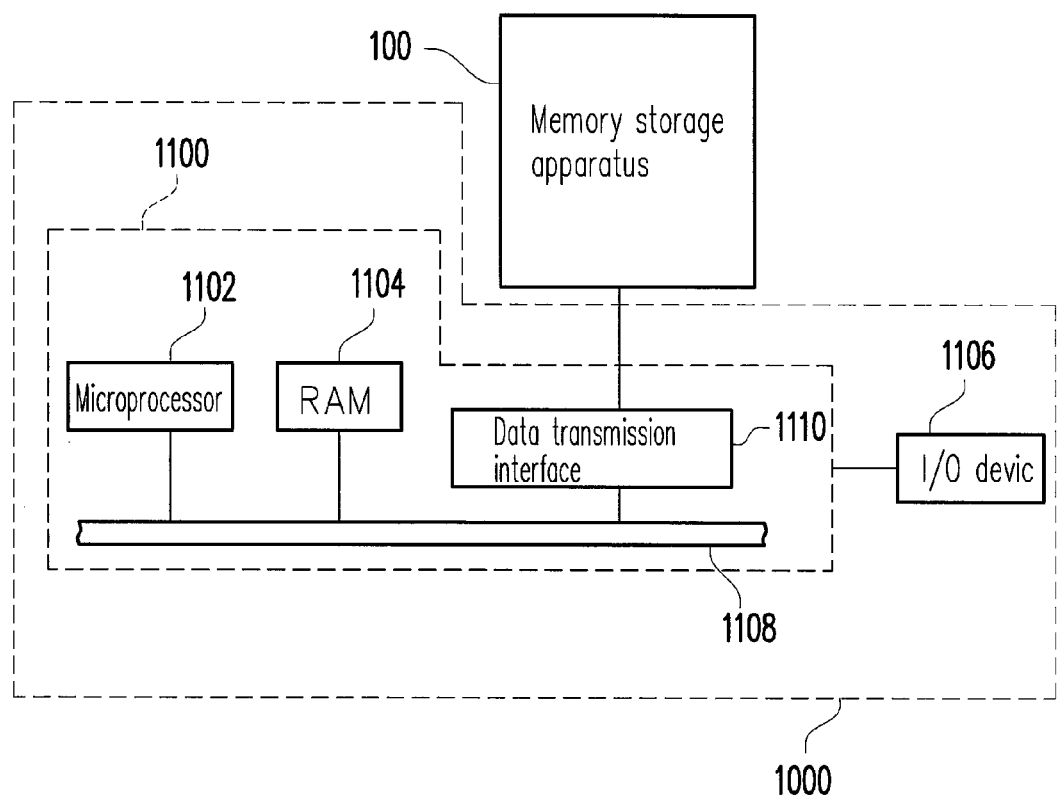
FIG. 1A illustrates a host system and a memory storage apparatus according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In an exemplary embodiment of the invention, the physical pages of a rewritable non-volatile memory module are grouped into a plurality of physical page groups, and a corresponding threshold voltage set is configured for each of the physical page groups. Besides, data in the physical pages of the physical page groups is respectively read by using the corresponding threshold voltage sets. In particular, when the read data cannot be corrected by using an error checking and correcting (ECC) circuit, the corresponding threshold voltage set is adjusted according to error bit information obtained from an adjacent physical page. Since the threshold voltage set is adjusted according to the characteristics of the corresponding physical page group, the accuracy of the data is ensured. Below, the technique provided by the invention will be described in detail with reference to exemplary embodiments.

A memory storage apparatus (also referred to as a memory storage system) usually includes a rewritable non-volatile memory module and a controller (also referred to as a control circuit). The memory storage apparatus is usually used together with a host system so that the host system can write data into or read data from the memory storage apparatus.

FIG. 1A illustrates a host system and a memory storage apparatus according to an exemplary embodiment of the invention.

Figure 1B:
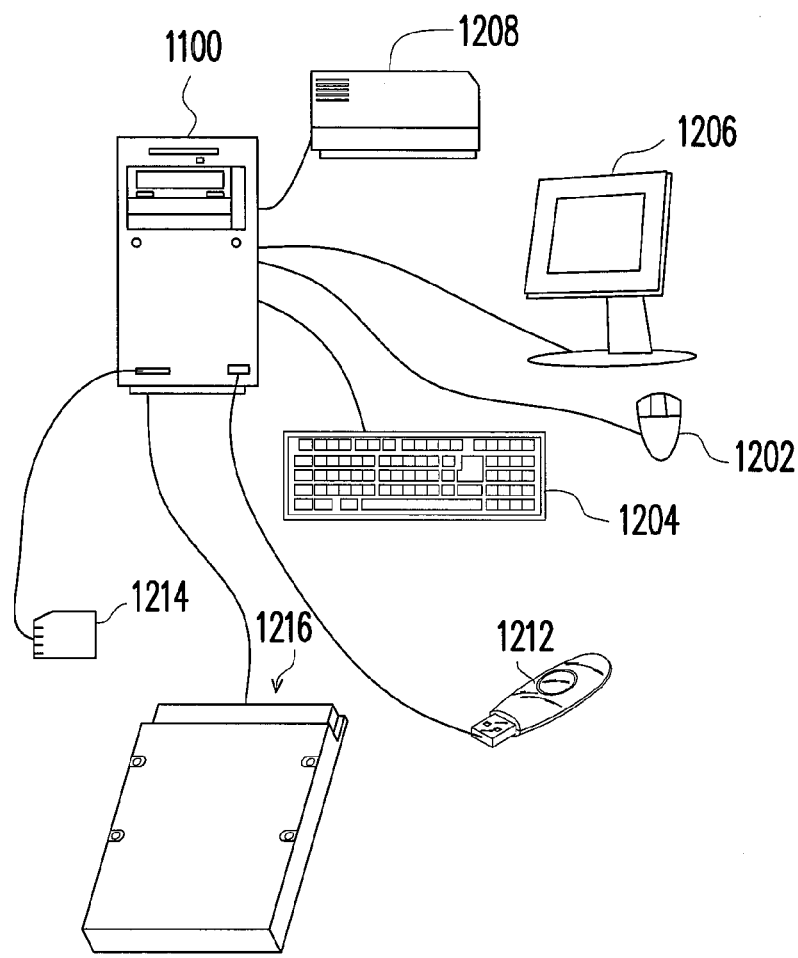
FIG. 1B is a diagram of a computer, input/output (I/O) devices, and a memory storage apparatus according to an exemplary embodiment of the invention.

Referring to FIG. 1A, the host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the I/O device 1106 is not limited to the devices illustrated in FIG. 1B, and which may further include other devices.

In the present embodiment, the memory storage apparatus 100 is coupled to other components of the host system 1000 through the data transmission interface 1110. Through the operations of the microprocessor 1102, the RAM 1104, and the I/O device 1106, data can be written into or read from the memory storage apparatus 100. For example, the memory storage apparatus 100 may be a rewritable non-volatile memory storage apparatus, such as a flash drive 1212, a memory card 1214, or a solid state drive (SSD) 1216 as shown in FIG. 1B.

Figure 1C:
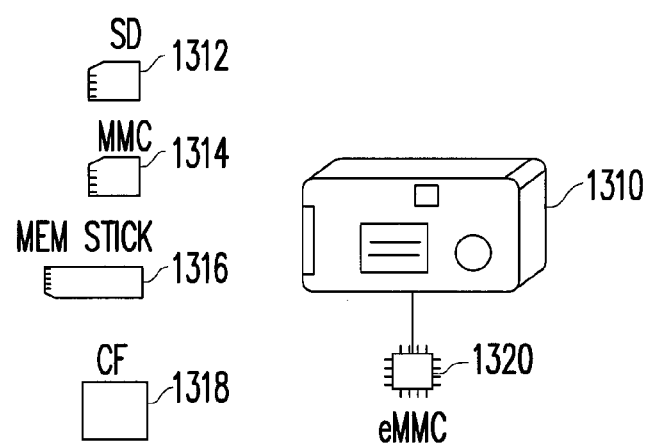
FIG. 1C is a diagram of a host system and a memory storage apparatus according to another exemplary embodiment of the invention.

Generally speaking, the host system 1000 can be substantially any system that can cooperate with the memory storage apparatus 100 to store data. Even though the host system 1000 is described as a computer system in the present exemplary embodiment, in another exemplary embodiment of the invention, the host system 1000 may also be a digital camera, a video camera, a communication device, an audio player, or a video player. For example, if the host system is a digital camera (video camera) 1310, the rewritable non-volatile memory storage apparatus may be a secure digital (SD) card 1312, a multi media card (MMC) 1314, a memory stick (MS) 1316, a compact flash (CF) card 1318, or an embedded storage apparatus 1320 (as shown in FIG. 1C) used by the digital camera (video camera) 1310. The embedded storage apparatus 1320 includes an embedded MMC (eMMC). It should be mentioned that the eMMC is directly coupled to the motherboard of the host system.

Figure 2:
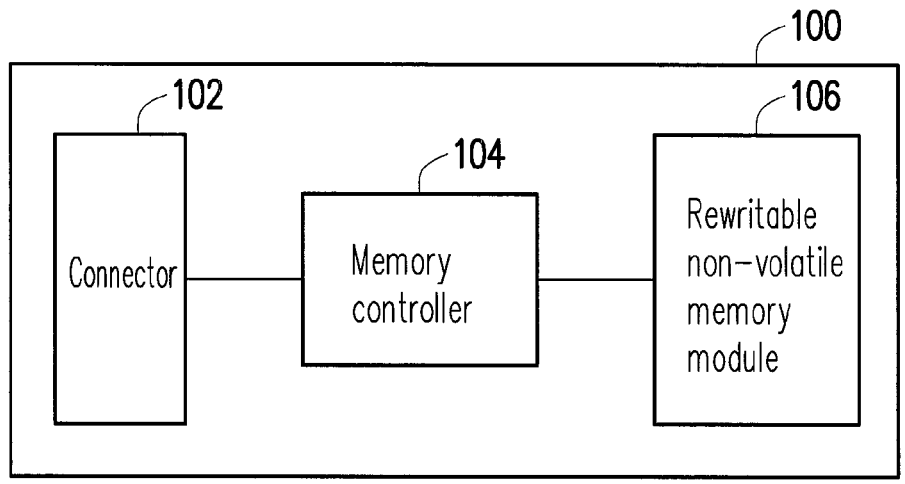
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a rewritable non-volatile memory module 106.

In the present exemplary embodiment, the connector 102 is compatible to the serial advanced technology attachment (SATA) standard. However, the invention is not limited thereto, and the connector 102 may also be compatible to the Institute of Electrical and Electronic Engineers (IEEE) 1394 standard, the peripheral component interconnect (PCI) express standard, the universal serial bus (USB) standard, the SD interface standard, the MS interface standard, the MMC interface standard, the CF interface standard, the integrated device electronics (IDE) interface standard, or any other suitable standard.

The memory controller 104 executes a plurality of logic gates or control instructions implemented in a hardware or firmware form and performs various data operations on the rewritable non-volatile memory module 106 according to instructions of the host system 1000.

The rewritable non-volatile memory module 106 is coupled to the memory controller 104 and configured for storing data written by the host system 1000. In the present exemplary embodiment, the rewritable non-volatile memory module 106 is a multi level cell (MLC) NAND flash memory module. However, the invention is not limited thereto, and the rewritable non-volatile memory module 106 may also be any other flash memory module or any other memory module having the same characteristics.

Figure 3:
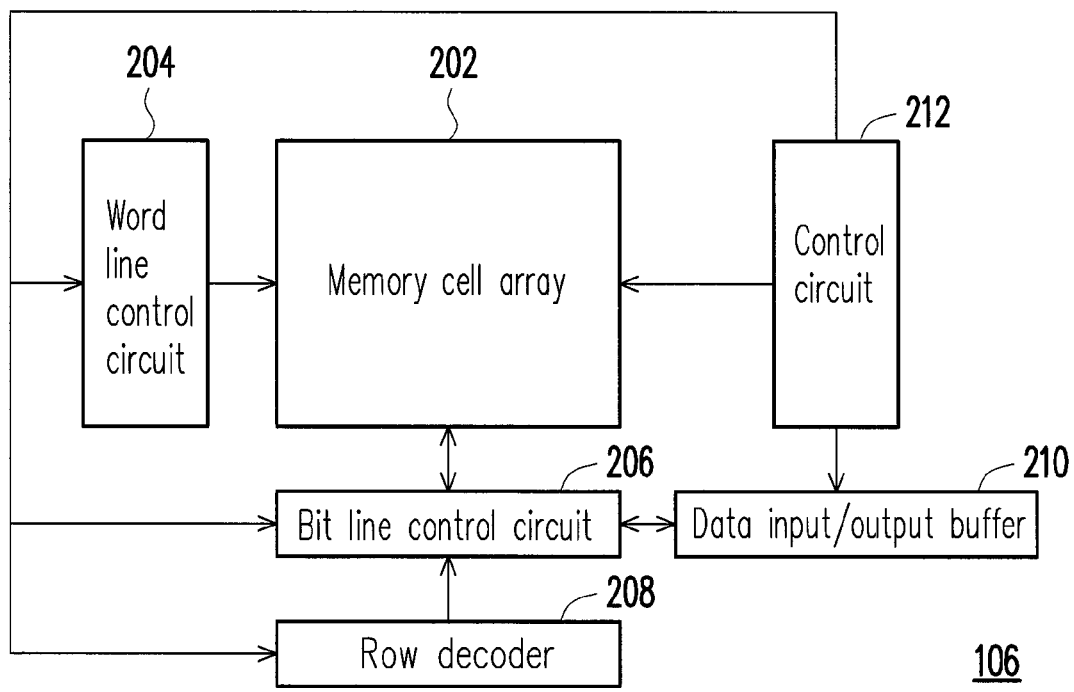
FIG. 3 is a schematic block diagram of a rewritable non-volatile memory module according to an exemplary embodiment of the invention.

FIG. 3 is a schematic block diagram of a rewritable non-volatile memory module according to an exemplary embodiment of the invention.

The rewritable non-volatile memory module 106 includes a memory cell array 202, a word line control circuit 204, a bit line control circuit 206, a row decoder 208, a data input/output (I/O) buffer 210, and a control circuit 212.

The memory cell array 202 includes a plurality of memory cells (not shown) for storing data, a plurality of bit lines (not shown) for connecting the memory cells, a plurality of word lines, and a common source line (not shown). The memory cells are disposed on the cross points of the bit lines and the word lines as an array. When a write command or a read command is received from the memory controller 104, the control circuit 212 controls the word line control circuit 204, the bit line control circuit 206, the row decoder 208, and the data I/O buffer 210 to write data into the memory cell array 202 or read data from the memory cell array 202, wherein the word line control circuit 204 controls the word line voltages applied to the word lines, the bit line control circuit 206 controls the bit lines, the row decoder 208 selects the corresponding bit line according to the decoding column address in the command, and the data I/O buffer 210 stores the data temporarily.

In the present exemplary embodiment, the rewritable non-volatile memory module 106 is a MLC NAND flash memory module, wherein a plurality of floating voltages is used for representing a multi-bit data. To be specific, each memory cell of the memory cell array 202 has a plurality of storage states, and the storage states are distinguished by a plurality of threshold voltages.

Figure 4:
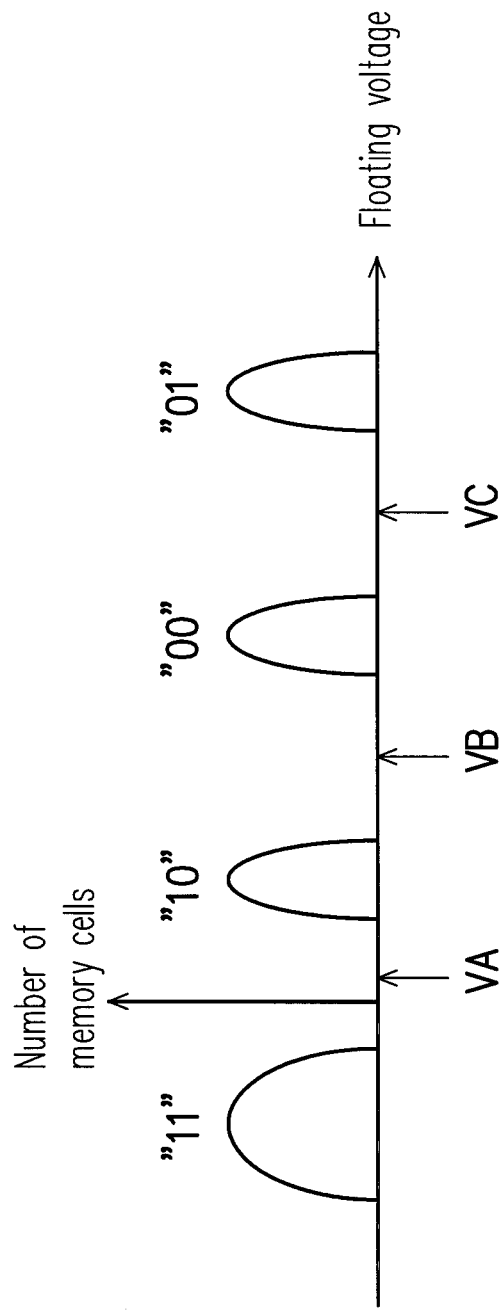
FIG. 4 illustrates the statistical distribution of floating voltages corresponding to data stored in a memory cell array according to an exemplary embodiment of the invention.

FIG. 4 illustrates the statistical distribution of floating voltages corresponding to data stored in a memory cell array according to an exemplary embodiment of the invention.

Referring to FIG. 4, taking a 4-level cell NAND flash memory as an example, the floating voltage in each memory cell can be distinguished into 4 storage states according to a first threshold voltage VA, a second threshold voltage VB, and a third threshold voltage VC, and these storage states respectively represent "11", "10", "00", and "01". In other words, each storage state includes a least significant bit (LSB) and a most significant bit (MSB). In the present exemplary embodiment, the first bit from the left of the storage states (i.e., "11", "10", "00", and "01") is the LSB, and the second bit from the left of the storage states is the MSB. Thus, in the first exemplary embodiment, each memory cell stores data of 2 bits. It should be understood that the floating voltages and the storage states illustrated in FIG. 3 are only examples. In another exemplary embodiment of the invention, the storage states may also have such an arrangement as "11", "10", "01", and "00" along with the increase of the floating voltages. Or, the storage states corresponding to the floating voltages may also be values obtained by mapping or inverting actual storage values. Additionally, in yet another exemplary embodiment, the first bit from the left may also be defined as the MSB while the second bit from the left as the LSB.

In the present exemplary embodiment, each memory cell stores data of 2 bits. Thus, the memory cells on the same word line constitute a storage space of 2 physical pages (i.e., a lower page and an upper page). Namely, the LSB of each memory cell is corresponding to the lower page, and the MSB of each memory cell is corresponding to the upper page. Besides, several physical pages in the memory cell array 202 constitute a physical block. Herein physical block is the smallest unit for erasing data. Namely, each physical block contains the least number of memory cells that are erased together.

To write data into a memory cell of the memory cell array 202, the floating voltage of the memory cell is changed with an injection voltage so that a different storage state is presented. For example, when the lower page data is 1 and the upper page data is also 1, the control circuit 212 controls the word line control circuit 204 to not change the floating voltage in the memory cell, so as to keep the storage state of the memory cell as "11". When the lower page data is 1 and the upper page data is 0, the control circuit 212 controls the word line control circuit 204 to change the floating voltage in the memory cell, so as to change the storage state of the memory cell to "10". When the lower page data is 0 and the upper page data is also 0, the control circuit 212 controls the word line control circuit 204 to change the floating voltage in the memory cell, so as to change the storage state of the memory cell to "00". When the lower page data is 0 and the upper page data is 1, the control circuit 212 controls the word line control circuit 204 to change the floating voltage in the memory cell, so as to change the storage state of the memory cell to "01".

Figure 5:
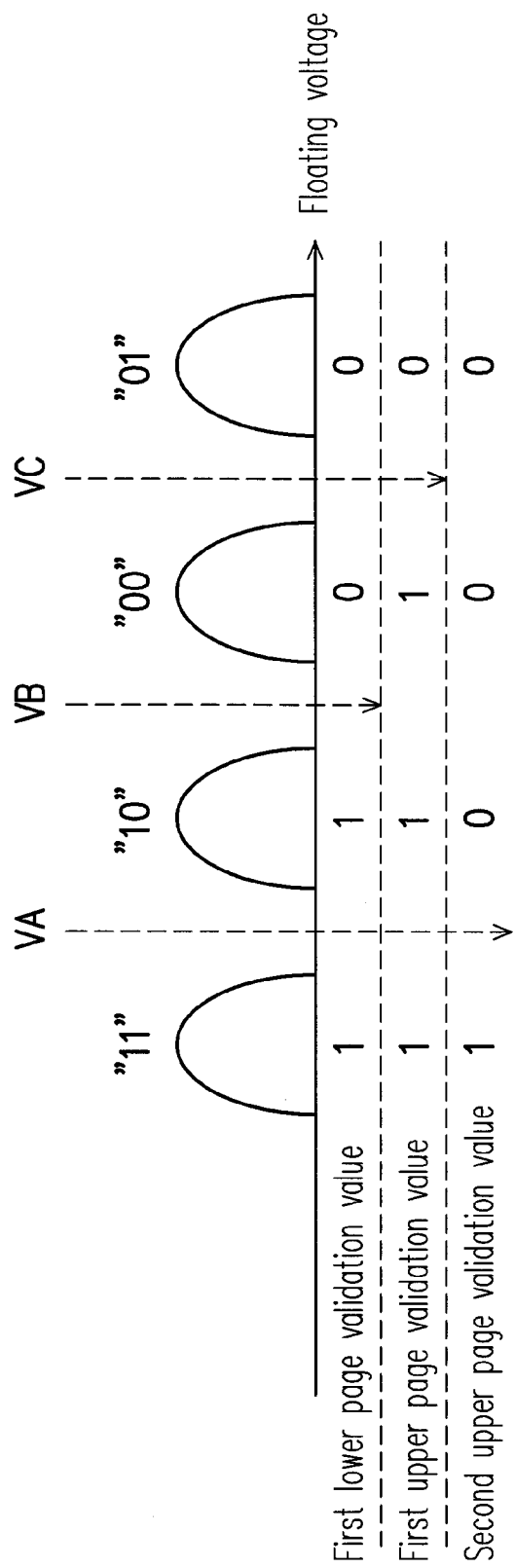
FIG. 5 is a diagram illustrating how a memory cell is read according to an exemplary embodiment of the invention.

FIG. 5 is a diagram illustrating how a memory cell is read according to a first exemplary embodiment of the invention.

Referring to FIG. 5, the floating voltage in a memory cell of the memory cell array 202 is distinguished by using threshold voltages, so as to read data from the memory cell. In an operation for reading data from a lower page, the word line control circuit 204 applies the second threshold voltage VB to the memory cell and determines the value of the lower page data according to whether a control gate of the memory cell is turned on and following expression (1):

$$LSB=(VB)\text{Lower\_pre1} \qquad (1)$$

In foregoing expression (1), (VB)Lower_pre1 represents a first lower page validation value obtained by applying the second threshold voltage VB.

For example, when the second threshold voltage VB is lower than the floating voltage in the memory cell, the control gate of the memory cell is not turned on and a first lower page validation value, which is '0', is output. Accordingly, the LSB is identified as 0. When the second threshold voltage VB is higher than the floating voltage in the memory cell, the control gate of the memory cell is turned on and a first lower page validation value, which is '1', is output. Accordingly, the LSB is identified as 1. Namely, the floating voltage for presenting the LSB as value 1 and the floating voltage for presenting the LSB as value 0 can be distinguished by the second threshold voltage VB.

In an operation for reading data from an upper page, the word line control circuit 204 respectively applies the third threshold voltage VC and the first threshold voltage VA to the memory cell and determines the value of the upper page data according to whether the control gate of the memory cell is turned on and following expression (2):

$$MSB=((VA)\text{Upper\_pre2})xor(\sim(VC)\text{Upper\_pre1}) \qquad (2)$$

In foregoing expression (2), (VC)Upper_pre1 represents a first upper page validation value obtained by applying the third threshold voltage VC, and (VA)Upper_pre2 represents a second upper page validation value obtained by applying the first threshold voltage VA, wherein the symbol "~" represents inversion. Additionally, in the present exemplary embodiment, when the third threshold voltage VC is lower than the floating voltage in the memory cell, the control gate of the memory cell is not turned on and a first upper page validation value ((VC)Upper_pre1), which is '0', is output. When the first threshold voltage VA is lower than the floating voltage in the memory cell, the control gate of the memory cell is not turned on and a second upper page validation value ((VA) Upper_pre2), wheich is '0', is output.

Thus, in the present exemplary embodiment, according to the expression (2), when the third threshold voltage VC and the first threshold voltage VA are both lower than the floating voltage in the memory cell, under the third threshold voltage VC, the control gate of the memory cell is not turned on and a first upper page validation value, which is '0', is output, and under the first threshold voltage VA, the control gate of the memory cell is not turned on and a second upper page validation value, which is '0', is output. Herein the MSB is identified as 1.

For example, when the third threshold voltage VC is higher than the floating voltage of the memory cell and the first threshold voltage VA is lower than the floating voltage of the memory cell, under the third threshold voltage VC, the control gate of the memory cell is turned on and a first upper page validation value, which is '1', is output, and under the first threshold voltage VA, the control gate of the memory cell is not turned on and a second upper page validation value, which is '0', is output. Herein the MSB is identified as 0.

For example, when the third threshold voltage VC and the first threshold voltage VA are both higher than the floating voltage of the memory cell, under the third threshold voltage VC, the control gate of the memory cell is turned on and a first upper page validation value, which is '1', is output, and under the first threshold voltage VA, the control gate of the memory cell is turned on and a second upper page validation value, which is '1', is output. Herein the MSB is identified as 1.

Even though the present embodiment is described by taking a 4-level cell NAND flash memory as an example, the invention is not limited thereto, and data can be read from any other MLC NAND flash memory through the technique described above.

Figure 6:
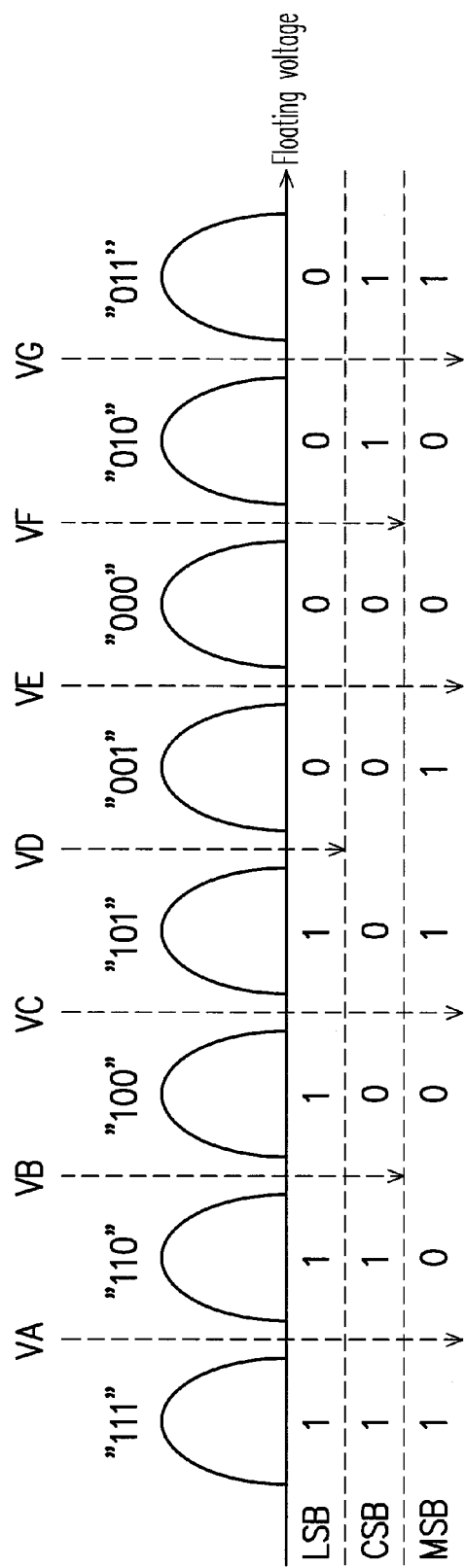
FIG. 6 is a diagram illustrating how an 8-level cell is read according to another exemplary embodiment of the invention.

Taking an 8-level cell NAND flash memory (as shown in FIG. 6) as an example, each storage state includes a LSB (the first bit from the left), a center significant bit (CSB, the second bit from the left), and a MSB (the third bit from the left), wherein the LSB is corresponding to a lower page, the CSB is corresponding to a middle page, and the MSB is corresponding to an upper page. In the present example, the floating voltage in each memory cell is distinguished into 8 storage states (i.e., "111", "110", "100", "101", "001", "000", "010", and "011") according to a first threshold voltage VA, a second threshold voltage VB, a third threshold voltage VC, a fourth threshold voltage VD, a fifth threshold voltage VE, a sixth threshold voltage VF, and a seventh threshold voltage VG.

Figure 7:
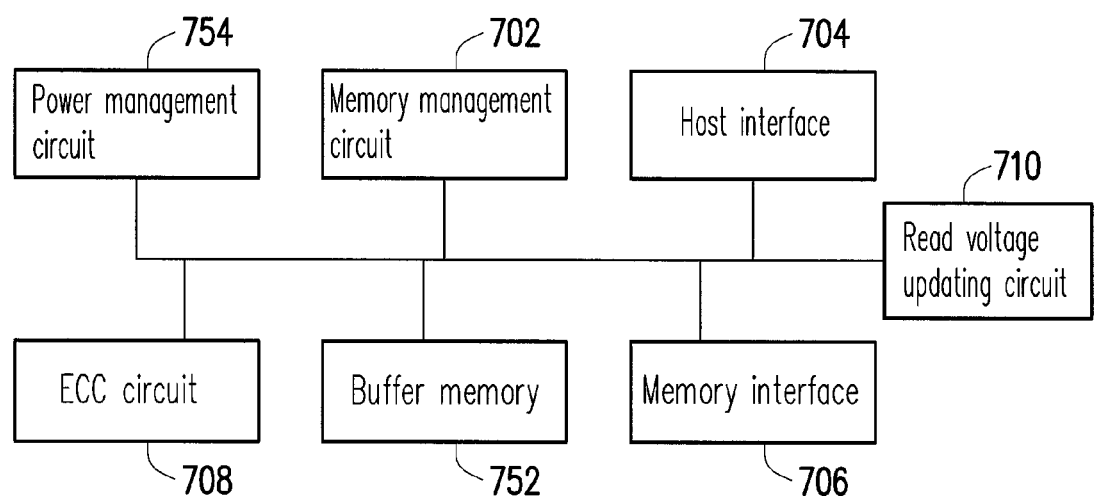
FIG. 7 is a schematic block diagram of a memory controller according to an exemplary embodiment of the invention.

FIG. 7 is a schematic block diagram of a memory controller according to an exemplary embodiment of the invention.

Referring to FIG. 7, the memory controller 104 includes a memory management circuit 702, a host interface 704, a memory interface 706, an error checking and correcting (ECC) circuit 708, and a read voltage updating circuit 710.

The memory management circuit 702 controls the overall operation of the memory controller 104. To be specific, the memory management circuit 702 has a plurality of control instructions, and when the memory storage apparatus 100 is in operation, the control instructions are executed to perform various data operations on the rewritable non-volatile memory module 106 according to instructions of the host system 1000.

In the present exemplary embodiment, the control instructions of the memory management circuit 702 are implemented in a firmware form. For example, the memory management circuit 702 has a microprocessor unit (not shown) and a read-only memory (ROM, not shown), and the control instructions are burnt into the ROM. When the memory storage apparatus 100 is in operation, the control instructions are executed by the microprocessor unit.

In another exemplary embodiment of the invention, the control instructions of the memory management circuit 702 may also be stored in a specific area of the rewritable non-volatile memory module 106 (for example, a system area exclusively used for storing system data in a memory module) as program codes. Besides, the memory management circuit 702 has a microprocessor unit (not shown), a ROM (not shown), and a RAM (not shown). In particular, the ROM has a driving code, and when the memory controller 104 is enabled, the microprocessor unit first executes the driving code to load the control instructions from the rewritable non-volatile memory module 106 into the RAM of the memory management circuit 702. Thereafter, the microprocessor unit runs the control instructions to execute different data operations. Additionally, in another exemplary embodiment of the invention, the control instructions of the memory management circuit 702 may also be implemented in a hardware form.

The host interface 704 is coupled to the memory management circuit 702 and configured for receiving and identifying commands and data received from the host system 1000. Namely, commands and data transmitted by the host system 1000 are sent to the memory management circuit 702 through the host interface 704. In the present exemplary embodiment, the host interface 704 is compatible to the SATA standard. However, the invention is not limited thereto, and the host interface 704 may also be compatible to the PATA standard, the IEEE 1394 standard, the PCI express standard, the USB standard, the SD standard, the MS standard, the MMC standard, the CF standard, the IDE standard, or any other suitable data transmission standard.

The memory interface 706 is coupled to the memory management circuit 702 and configured to access the rewritable non-volatile memory module 106. Namely, data to be written into the rewritable non-volatile memory module 106 is converted by the memory interface 706 into a format acceptable to the rewritable non-volatile memory module 106.

The ECC circuit 708 is coupled to the memory management circuit 702 and configured to execute an ECC procedure to ensure data accuracy. To be specific, when the memory management circuit 702 receives a write command from the host system 1000, the ECC circuit 708 generates a corresponding ECC code for the data corresponding to the write command, and the memory management circuit 702 writes the data corresponding to the write command and the corresponding ECC code into the rewritable non-volatile memory module 106. Subsequently, when the memory management circuit 702 reads the data from the rewritable non-volatile memory module 106, it also reads the ECC code corresponding to the data, and the ECC circuit 708 executes the ECC procedure on the data according to the ECC code.

The read voltage updating circuit 710 is coupled to the memory management circuit 702 and configured to adjust a threshold voltage set adopted when the memory management circuit 702 reads data from the rewritable non-volatile memory module 106. The method for adjusting the threshold voltage set will be described in detail later on with reference to accompanying drawings.

In an exemplary embodiment of the invention, the memory controller 104 further includes a buffer memory 752. The buffer memory 752 is coupled to the memory management circuit 702 and configured to temporarily store data and commands received from the host system 1000 or data received from the rewritable non-volatile memory module 106.

In an exemplary embodiment of the invention, the memory controller 104 further includes a power management circuit 754. The power management circuit 754 is coupled to the memory management circuit 702 and configured to control the power supply of the memory storage apparatus 100.

Figure 8:
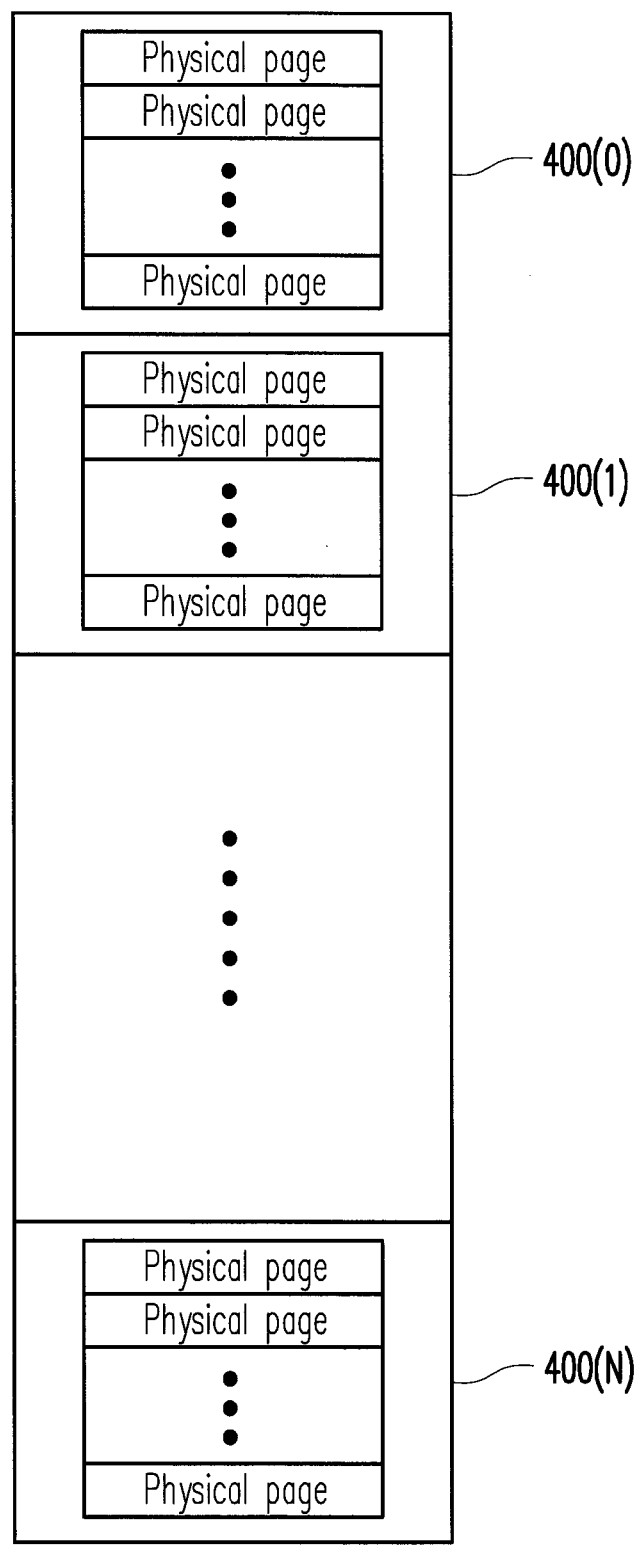
FIG. 8 is a diagram illustrating how a rewritable non-volatile memory module is managed according to an exemplary embodiment of the invention.

FIG. 8 is a diagram illustrating how a rewritable non-volatile memory module is managed according to an exemplary embodiment of the invention.

Referring to FIG. 8, the memory management circuit 702 groups the physical pages of the rewritable non-volatile memory module 106 into physical page groups 400(0)-400 (N). In the present exemplary embodiment, the memory management circuit 702 groups the physical pages belonging to the same physical block into a physical page group. Namely, in the present exemplary embodiment, the physical pages in a physical page group are exactly the physical pages in a physical block. However, the invention is not limited thereto, and in another exemplary embodiment of the invention, the memory management circuit 702 may also group the physical pages belonging to the same plane into a physical page group or define each individual physical page as a physical page group.

In the present exemplary embodiment, the memory management circuit 702 configures an independent threshold voltage set for each physical page group. For example, assuming the rewritable non-volatile memory module 106 to be a 4-level cell NAND flash memory module, each threshold voltage set includes a first threshold voltage VA, a second threshold voltage VB, and a third threshold voltage VC. Besides, the memory management circuit 702 reads data from the physical pages of a physical page group by using the corresponding threshold voltage set.

For example, the memory management circuit 702 establishes a read voltage table to record the threshold voltage set corresponding to each physical page group. Besides, when data is to be read from a physical page, the memory management circuit 702 identifies the corresponding threshold voltage set in the read voltage table and reads the data by using the corresponding threshold voltage set.

Namely, to read data from a physical page of the physical page group 400(0), the memory management circuit 702 reads the data by using the first threshold voltage VA, the second threshold voltage VB, and the third threshold voltage VC corresponding to the physical page group 400(0). To read data from a physical page of the physical page group 400(N), the memory management circuit 702 reads the data by using the first threshold voltage VA, the second threshold voltage VB, and the third threshold voltage VC corresponding to the physical page group 400(N).

Particularly, in the present exemplary embodiment, when the ECC circuit 708 cannot correct data read by the memory management circuit 702 from a physical page, the memory management circuit 702 reads data correctable to the ECC circuit 708 from other physical pages of the same physical page group, and the read voltage updating circuit 710 obtains error bit information according to the correctable data to adjust the corresponding threshold voltage set.

Figure 9:
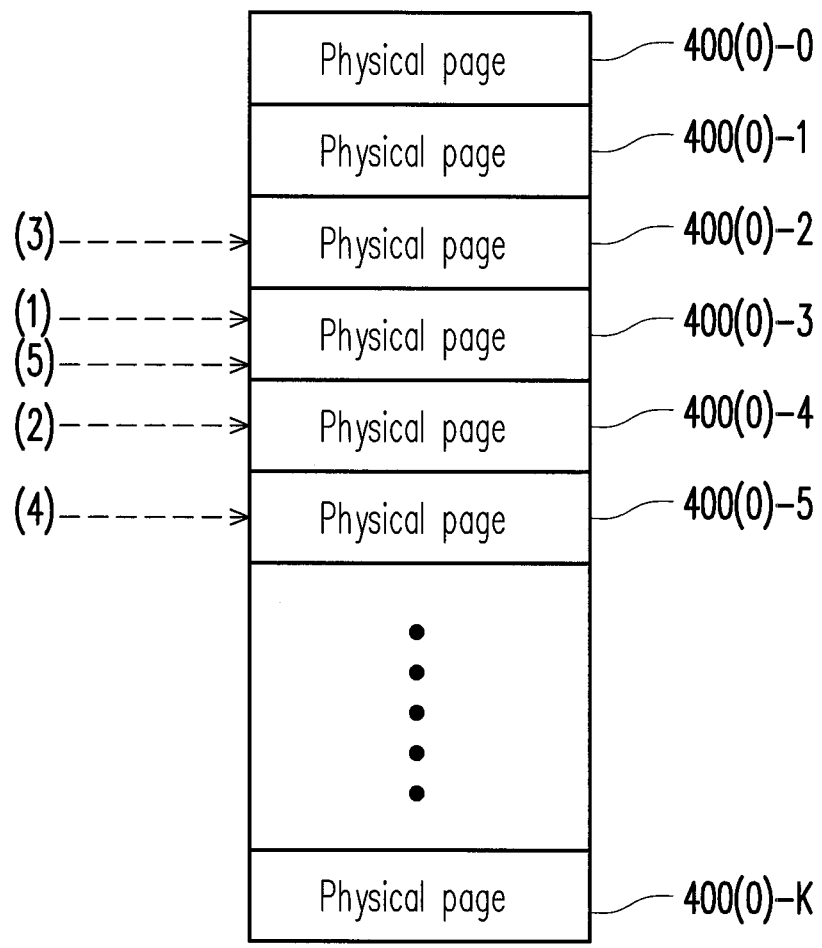
FIG. 9 illustrates an example of a data reading process according to an exemplary embodiment of the invention.

FIG. 9 illustrates an example of a data reading process according to an exemplary embodiment of the invention.

Referring to FIG. 9, if the memory management circuit 702 is about to read data from a first physical page (for example, the physical page 400(0)-3) of a first physical page group (for example, the physical page group 400(0)), in step (1), the memory management circuit 702 reads an uncorrected data (also referred to as a first data) from the first physical page by using the threshold voltage set corresponding to the physical page group 400(0). For example, if the first physical page is a lower page, the memory management circuit 702 identifies the value of each bit in the physical page by using the second threshold voltage VB corresponding to the physical page group 400(0). If the first physical page is an upper page, the memory management circuit 702 identifies the value of each bit in the physical page by using the first threshold voltage VA and the third threshold voltage VC corresponding to the physical page group 400(0).

After reading the data, the ECC circuit 708 performs an ECC procedure according to an ECC code corresponding to the uncorrected data, and the memory management circuit 702 determines whether the uncorrected data can be corrected to generate a corrected data. If the uncorrected data cannot be corrected, the memory management circuit 702 reads data from the physical pages adjacent to the first physical page until the read data can be corrected by the ECC circuit 708.

For example, referring to FIG. 9, in step (2), the memory management circuit 702 first reads an uncorrected data from the physical page 400(0)-4. If the uncorrected data read from the physical page 400(0)-4 is still not correctable, in step (3), the memory management circuit 702 reads another uncorrected data from the physical page 400(0)-2. If the uncorrected data read from the physical page 400(0)-2 is still not correctable, in step (3), the memory management circuit 702 reads yet another uncorrected data from the physical page 400(0)-5, and so on. Eventually, if the uncorrected data (also referred to as a second data) read from a second physical page (for example, the physical page 400(0)-5) can be corrected to generate a corrected data corresponding to the second physical page, the memory management circuit 702 sends the uncorrected data and the corrected data corresponding to the second physical page to the read voltage updating circuit 710.

Thereafter, the read voltage updating circuit 710 generates compensation voltages according to the uncorrected data and the corrected data corresponding to the second physical page and updates the threshold voltages corresponding to the second physical page into adjusted threshold voltages.

To be specific, the read voltage updating circuit 710 sequentially compares corresponding bits in the uncorrected data and the corrected data corresponding to the second physical page and identifies error bits among these bits. Herein an error bit refers to a bit that is in one state but is mistaken as being in another state. Besides, the read voltage updating circuit 710 identifies and serves the error bit types of these error bits as the error bit information and generates the compensation voltages for adjusting the threshold voltages according to the error bit information.

Figure 10:
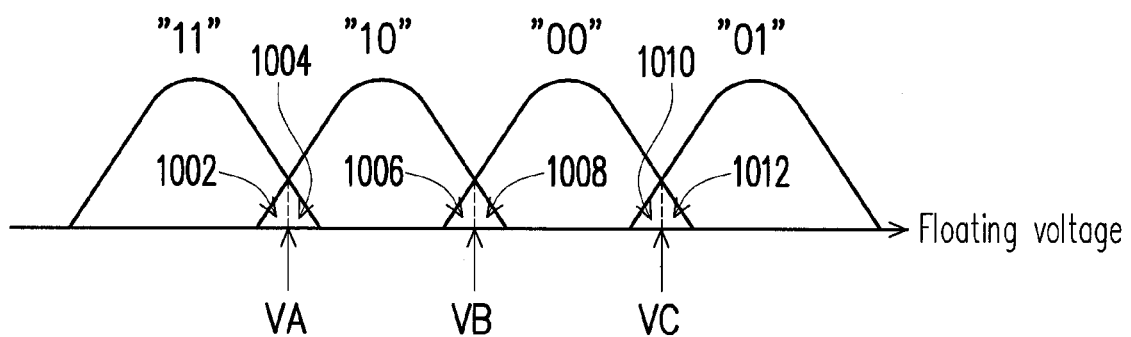
FIG. 10 is a diagram illustrating different error bit types according to an exemplary embodiment of the invention.

FIG. 10 is a diagram illustrating different error bit types according to an exemplary embodiment of the invention.

Referring to FIG. 10, taking a 4-level cell NAND flash memory as an example, the first threshold voltage VA is used for differentiating the storage state "11" from the storage state "10", the second threshold voltage VB is used for differentiating the storage state "10" from the storage state "00", and the third threshold voltage VC is used for differentiating the storage state "00" from the storage state "01". Herein the state to the left of a threshold voltage is referred to as a first storage state, and the state to the right of the threshold voltage is referred to as a second storage state.

In particular, regarding each threshold voltage, the read voltage updating circuit 710 counts the number of memory cells that are in the first storage state but are mistaken as being in the second storage state (i.e., the first error bit type) and the number of memory cells that are in the second storage state but are mistaken as being in the first storage state (i.e., the second error bit type).

As shown in FIG. 10, the block 1002 represents the memory cells that are in the storage state "10" but are mistaken as being in the storage state "11", and the block 1004 represents the memory cells that are in the storage state "11" but are mistaken as being in the storage state "10". In particularly, the read voltage updating circuit 710 generates the compensation voltage corresponding to the first threshold voltage VA according to the number of error bits corresponding to the block 1002 and the number of error bits corresponding to the block 1004. Besides, the read voltage updating circuit 710 adds the compensation voltage to the first threshold voltage VA to obtain a new first threshold voltage VA (i.e., the adjusted threshold voltage).

For example, the read voltage updating circuit 710 calculates the compensation voltages by using following expression (3):

$$x = g \times \log_2\left(\frac{\text{error } 2}{\text{error } 1}\right) \quad (3)$$

In foregoing expression (3), x represents the compensation voltage, g is a constant, error2 is the number of memory cells that are in the second storage state but are mistaken as being in the first storage state, and error1 is the number of memory cells that are in the first storage state but are mistaken as being in the second storage state.

Similarly, the read voltage updating circuit 710 generates the compensation voltage corresponding to the second threshold voltage VB according to the number of error bits corresponding to the block 1006 and the number of error bits corresponding to the block 1008. Besides, the read voltage updating circuit 710 adds the compensation voltage to the second threshold voltage VB to obtain a new second threshold voltage VB.

Similarly, the read voltage updating circuit 710 generates the compensation voltage corresponding to the third threshold voltage VC according to the number of error bits corresponding to the block 1010 and the number of error bits corresponding to the block 1012. Besides, the read voltage updating circuit 710 adds the compensation voltage to the third threshold voltage VC to obtain a new third threshold voltage VC.

Thereafter, referring to FIG. 9, in step (5), the memory management circuit 702 reads data from the first physical page again by using the updated threshold voltages (i.e., the adjusted threshold voltages), and the ECC circuit 708 corrects the data to obtain the corrected data corresponding to the first physical page.

To be specific, because adjacent physical pages have similar physical characteristics, when data read from a specific physical page cannot be corrected, the threshold voltages can be adjusted by analyzing the error bit information of adjacent physical pages, so that data can be correctly read.

Figure 11:
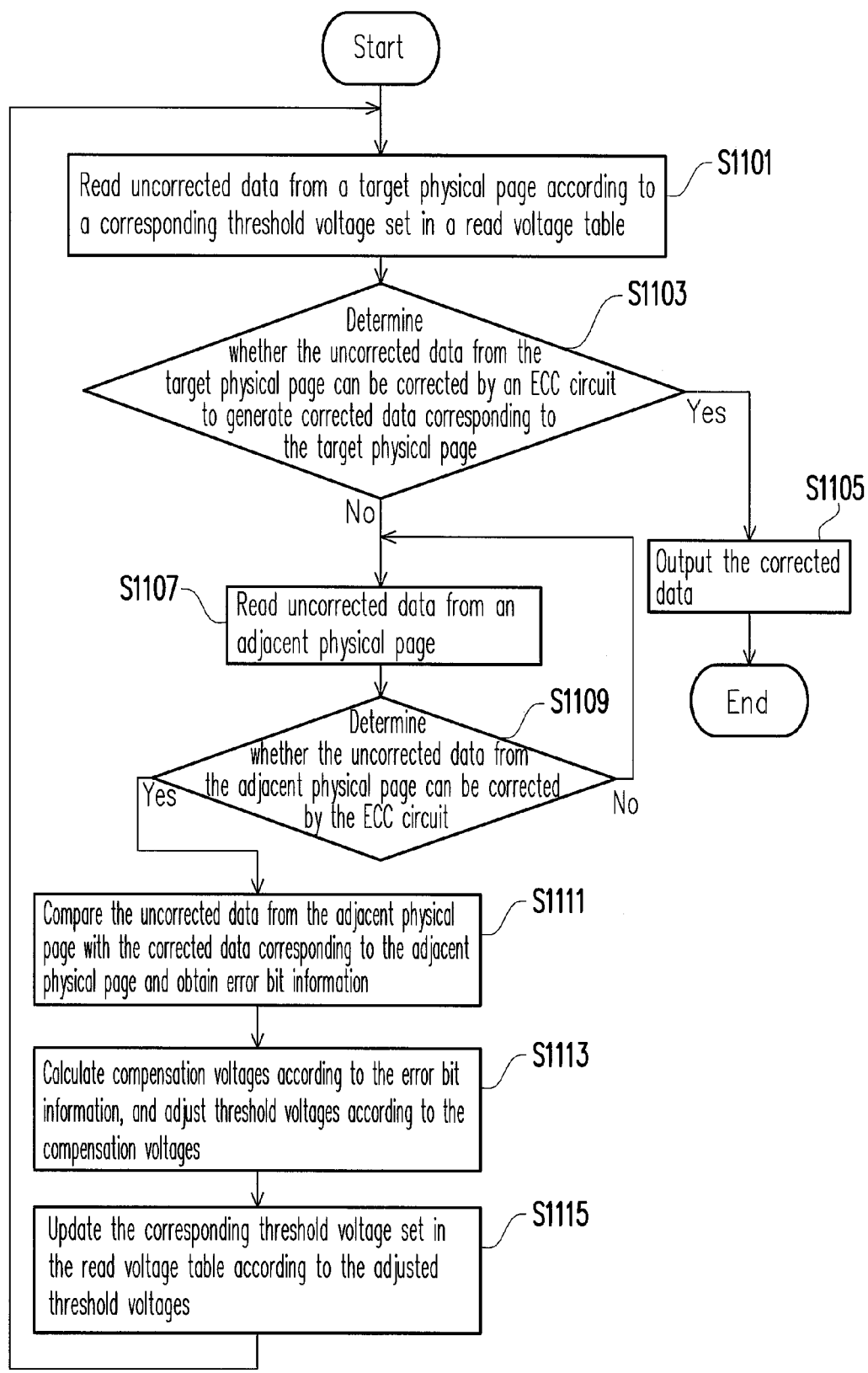
FIG. 11 is a flowchart of a data reading method according to an exemplary embodiment of the invention.

FIG. 11 is a flowchart of a data reading method according to an exemplary embodiment of the invention.

Referring to FIG. 11, in step S1101, the memory management circuit 702 reads an uncorrected data from a target physical page according to a corresponding threshold voltage set in a read voltage table. In step S1103, the memory management circuit 702 determines whether the uncorrected data from the target physical page can be corrected by the ECC circuit 708 to generate corrected data corresponding to the target physical page.

If the uncorrected data from the target physical page can be corrected, in step S1105, the memory management circuit 702 outputs the corrected data.

If the uncorrected data cannot be corrected, in step S1107, the memory management circuit 702 reads uncorrected data from an adjacent physical page. How to choose the adjacent physical page for reading data has been described above therefore will not be described herein.

Next, in step S1109, whether the uncorrected data from the adjacent physical page can be corrected by the ECC circuit 708 is determined. If the uncorrected data cannot be corrected, step S1107 is executed again.

If the uncorrected data can be corrected, in step S1111, the read voltage updating circuit 710 compares the uncorrected data from the adjacent physical page with the corrected data corresponding to the adjacent physical page and obtains error bit information.

Thereafter, in step S1113, the read voltage updating circuit 710 calculates compensation voltages according to the error bit information and adjusts the threshold voltages according to the compensation voltages.

Then, in step S1115, the memory management circuit 702 updates the corresponding threshold voltage, set in the read voltage table according to the adjusted threshold voltages.

Next, step S1101 is executed to read data from the target physical page again.

For example, in an exemplary embodiment of the invention, the memory management circuit 702 tries to read data from a target physical page according to the constantly adjusted threshold voltage set, and an error message is output if no corrected data corresponding to the target physical page can be obtained after reading data for a predetermined number of times.

In summary, exemplary embodiments of the invention provide a data reading method and a memory storage apparatus and a memory controller using the same, wherein data can be correctly read according to adjusted threshold voltages. In addition, when an ECC circuit cannot successfully correct an uncorrected data, the threshold voltages are adjusted according to an error bit information obtained from an adjacent physical page so that the corresponding corrected data can be obtained. Thereby, data storage stability can be improved. The previously described exemplary embodiments of the present invention have the advantages aforementioned, wherein the advantages aforementioned not required in all versions of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data reading method for a rewritable non-volatile memory module, wherein the rewritable non-volatile memory module has a plurality of physical pages, the data reading method comprising:

grouping the physical pages into a plurality of physical page groups;

configuring a threshold voltage set for each of the physical page groups, wherein each of the threshold voltage sets comprises a plurality of threshold voltages;

respectively reading data from the physical pages of the physical page groups by using the corresponding threshold voltage sets; and when data, read from one of the physical pages of one of the physical page groups, is uncorrectable, updating the threshold voltage set corresponding to the one of the physical page groups.

2. The data reading method according to claim 1 further comprising:
  establishing a read voltage table to record the threshold voltage sets corresponding to the physical page groups.

3. The data reading method according to claim 1, wherein the step of updating the threshold voltage set corresponding to the one of the physical page groups comprises:
  obtaining an uncorrected data corresponding to another one of the physical pages of the one of the physical page groups from the another physical page by using the threshold voltage set corresponding to the one of the physical page groups, wherein the another physical page is adjacent to the one of the physical pages, and the uncorrected data corresponding to the another physical page is corrected by using the ECC circuit to generate corrected data corresponding to the another physical page;
  comparing the uncorrected data with the corrected data corresponding to the another physical page to obtain error bit information;
  calculating at least one compensation voltage according to the error bit information; and
  adjusting at least one of the threshold voltages of the threshold voltage set corresponding to the one of the physical page groups by using the at least one compensation voltage.

4. A data reading method for a rewritable non-volatile memory module, wherein the rewritable non-volatile memory module has a plurality of physical pages that are sequentially arranged, the data reading method comprising:
  obtaining first data from a first physical page among the physical pages by using at least one threshold voltage;
  determining whether the first data is corrected by using an ECC circuit to generate first corrected data corresponding to the first physical page;
  obtaining second data from a second physical page among the physical pages when the first data is not corrected by using the ECC circuit to generate the first corrected data corresponding to the first physical page, wherein the second physical page is adjacent to the first physical page, and the second data is corrected by using the ECC circuit to generate second corrected data corresponding to the second physical page;
  comparing the second data with the second corrected data corresponding to the second physical page to obtain error bit information;
  calculating at least one compensation voltage according to the error bit information;
  adjusting the at least one threshold voltage into at least one adjusted threshold voltage by using the at least one compensation voltage; and
  obtaining another first data from the first physical page by using the at least one adjusted threshold voltage, and correcting the another first data by using the ECC circuit to generate the first corrected data corresponding to the first physical page.

5. The data reading method according to claim 4, wherein the second data has a plurality of bits, the rewritable non-volatile memory module has a plurality of storage states, and each of the bits is corresponding to one of the storage states of the rewritable non-volatile memory module,
  wherein the storage states comprise a first storage state and a second storage state, and a first threshold voltage among the at least one threshold voltage is used for differentiating the first storage state from the second storage state,
  wherein the step of comparing the second data with the second corrected data corresponding to the second physical page to obtain the error bit information comprises:
    finding out a plurality of error bits among the bits of the second data that are different from corresponding bits of the second corrected data;
    counting the number of error bits that belong to a first error bit type among the error bits, wherein the error bits belonging to the first error bit type are corresponding to the first storage state but are mistaken as being corresponding to the second storage state;
    counting the number of error bits that belong to a second error bit type among the error bits, wherein the error bits belonging to the second error bit type are corresponding to the second storage state but are mistaken as being corresponding to the first storage state; and
    serving the number of the error bits belonging to the first error bit type and the number of the error bits belonging to the second error bit type as the error bit information.

6. The data reading method according to claim 5, wherein the step of calculating the at least one compensation voltage according to the error bit information comprises:
  calculating a first compensation voltage among the at least one compensation voltage according to the number of the error bits belonging to the first error bit type and the number of the error bits belonging to the second error bit type.

7. The data reading method according to claim 6, wherein the step of adjusting the at least one threshold voltage into the at least one adjusted threshold voltage by using the at least one compensation voltage comprises:
  adjusting the first threshold voltage into a first adjusted threshold voltage among the at least one adjusted threshold voltage by using the first compensation voltage.

8. The data reading method according to claim 4 further comprising:
  establishing a read voltage table to record the at least one adjusted threshold voltage.

9. The data reading method according to claim 8 further comprising:
  grouping the physical pages into a plurality of physical page groups,
  wherein the first physical page and the second physical page belong to a first physical page group among the physical page groups, and the at least one adjusted threshold voltage is corresponding to the first physical page group.

10. The data reading method according to claim 9 further comprising:
  reading other physical pages of the first physical page group according to the read voltage table by using the at least one adjusted threshold voltage.

11. A memory controller for controlling a rewritable non-volatile memory module, wherein the rewritable non-volatile memory module has a plurality of physical pages, the memory controller comprising:
  a memory management circuit, configured to group the physical pages into a plurality of physical page groups, configure a threshold voltage set for each of the physical page groups, and respectively read data from the physical pages of the physical page groups by using the corresponding threshold voltage sets, wherein each of the threshold voltage sets comprises a plurality of threshold voltages;

a host interface, configured to couple to the memory management circuit;

a memory interface, coupled to the memory management circuit and configured to for couple to the rewritable non-volatile memory module;

an error checking and correcting (ECC) circuit, coupled to the memory management circuit; and a read voltage updating circuit, coupled to the memory management circuit, wherein when the ECC circuit does not correct data read by the memory management circuit from one of the physical pages of one of the physical page groups, the read voltage updating circuit updates the threshold voltage set corresponding to the one of the physical page groups.

12. A memory controller for controlling a rewritable non-volatile memory module, wherein the rewritable non-volatile memory module has a plurality of physical pages that are sequentially arranged, the memory controller comprising:

a memory management circuit;

a host interface, coupled to the memory management circuit;

a memory interface, coupled to the memory management circuit and configured to couple to the rewritable non-volatile memory module;

an ECC circuit, coupled to the memory management circuit; and a read voltage updating circuit, coupled to the memory management circuit, wherein the memory management circuit obtains first data from a first physical page among the physical pages by using at least one threshold voltage and determines whether the ECC circuit corrects the first data to generate first corrected data corresponding to the first physical page, wherein when the ECC circuit does not correct the first data to generate the first corrected data corresponding to the first physical page, the memory management circuit obtains second data from a second physical page among the physical pages, wherein the second physical page is adjacent to the first physical page, and the second data is corrected by the ECC circuit to generate second corrected data corresponding to the second physical page, wherein the read voltage updating circuit compares the second data with the second corrected data corresponding to the second physical page to obtain error bit information and calculates at least one compensation voltage according to the error bit information, wherein the read voltage updating circuit further adjusts the at least one threshold voltage into at least one adjusted threshold voltage according to the at least one compensation voltage, wherein the memory management circuit further obtains another first data from the first physical page by using the at least one adjusted threshold voltage, and the ECC circuit corrects the another first data to generate the first corrected data corresponding to the first physical page.

13. A memory storage apparatus, comprising:

a connector, configured to couple to a host system;

a rewritable non-volatile memory module, having a plurality of physical pages; and a memory controller, coupled to the connector and the rewritable non-volatile memory module, and having an ECC circuit, wherein the memory controller groups the physical pages into a plurality of physical page groups, configures a threshold voltage set for each of the physical page groups, and respectively reads data from the physical pages of the physical page groups by using the corresponding threshold voltage sets, wherein each of the threshold voltage sets comprises a plurality of threshold voltages;

wherein when the ECC circuit does not correct data read by the memory controller from one of the physical pages of one of the physical page groups, the memory controller updates the threshold voltage set corresponding to the one of the physical page groups.

14. The memory storage apparatus according to claim 13, wherein the memory controller further establishes a read voltage table for recording the threshold voltage sets corresponding to the physical page groups.

15. The memory storage apparatus according to claim 13, wherein the memory controller obtains an uncorrected data corresponding to another one of the physical pages of the one of the physical page groups from the another physical page by using the threshold voltage set corresponding to the one of the physical page groups, wherein the another physical page is adjacent to the physical page, wherein the ECC circuit corrects the uncorrected data corresponding to the another physical page to generate corrected data corresponding to the another physical page, wherein the memory controller compares the uncorrected data with the corrected data corresponding to the another physical page to obtain error bit information, calculates at least one compensation voltage according to the error bit information, and adjusts at least one of the threshold voltages of the threshold voltage set corresponding to the one of the physical page groups by using the at least one compensation voltage.

16. A memory storage apparatus, comprising:

a connector, configured to couple to a host system;

a rewritable non-volatile memory module, having a plurality of physical pages that are sequentially arranged; and a memory controller, coupled to the connector and the rewritable non-volatile memory module, and having an ECC circuit, wherein the memory controller obtains first data from a first physical page among the physical pages by using at least one threshold voltage and determines whether the ECC circuit corrects the first data to generate first corrected data corresponding to the first physical page, wherein when the ECC circuit does not correct the first data to generate the corrected data corresponding to the first physical page, the memory controller obtains second data from a second physical page among the physical pages, wherein the second physical page is adjacent to the first physical page, and the second data is corrected by the ECC circuit to generate second corrected data corresponding to the second physical page, wherein the memory controller further compares the second data with the second corrected data corresponding to the second physical page to obtain error bit information, calculates at least one compensation voltage according to the error bit information, and adjusts the at least one threshold voltage into at least one adjusted threshold voltage according to the at least one compensation voltage, wherein the memory controller further obtains another first data from the first physical page by using the at least one adjusted threshold voltage, and the ECC circuit corrects the another first data to generate the first corrected data corresponding to the first physical page.

17. The memory storage apparatus according to claim 16, wherein the second data has a plurality of bits, the rewritable non-volatile memory module has a plurality of storage states and each of the bits is corresponding to one of the storage states of the rewritable non-volatile memory module,
- wherein the storage states comprise a first storage state and a second storage state, and a first threshold voltage among the at least one threshold voltage is used for differentiating the first storage state from the second storage state,
- wherein the memory controller finds out a plurality of error bits among the bits of the second data that are different from corresponding bits of the second corrected data, counts the number of error bits that belong to a first error bit type among the error bits, counts the number of error bits that belong to a second error bit type among the error bits, and serves the number of the error bits belonging to the first error bit type and the number of the error bits belonging to the second error bit type as the error bit information,
- wherein the error bits belonging to the first error bit type are corresponding to the first storage state but are mistaken as being corresponding to the second storage state,
- wherein the error bits belonging to the second error bit type are corresponding to the second storage state but are mistaken as being corresponding to the first storage state.

18. The memory storage apparatus according to claim 17, wherein the memory controller calculates a first compensation voltage among the at least one compensation voltage according to the number of the error bits belonging to the first error bit type and the number of the error bits belonging to the second error bit type.

19. The memory storage apparatus according to claim 18, wherein the memory controller adjusts the first threshold voltage into a first adjusted threshold voltage among the at least one adjusted threshold voltage by using the first compensation voltage.

* * * * *